(12) United States Patent
Detavenier et al.

(10) Patent No.: US 7,732,870 B2
(45) Date of Patent: Jun. 8, 2010

(54) ELIMINATING METAL-RICH SILICIDES USING AN AMORPHOUS NI ALLOY SILICIDE STRUCTURE

(75) Inventors: Christophe Detavenier, Ghent (BE); Simon Gaudet, Montreal (CA); Christian Lavoie, Ossining, NY (US); Conal E. Murray, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 9 days.

(21) Appl. No.: 12/105,034

(22) Filed: Apr. 17, 2008

(65) Prior Publication Data

US 2008/0217780 A1 Sep. 11, 2008

Related U.S. Application Data (63) Continuation of application No. 11/173,038, filed on Jul. 1, 2005, now Pat. No. 7,419,907.

(51) Int. Cl.
   *H01L 29/78* (2006.01)
(52) U.S. Cl. .................. 257/377; 257/412; 257/413; 257/E29.156
(58) Field of Classification Search ............. 257/377, 257/E29.156
   See application file for complete search history.

(56) References Cited

U.S. PATENT DOCUMENTS

| | | |
|---|---|---|
| 5,302,552 A | 4/1994 | Duchateau et al. |
| 6,015,752 A | 1/2000 | Xiang et al. |
| 6,323,130 B1 | 11/2001 | Brodsky et al. |
| 6,468,901 B1 * | 10/2002 | Maa et al. ............ 438/655 |
| 6,531,396 B1 * | 3/2003 | Chi et al. ............ 438/682 |
| 6,534,871 B2 | 3/2003 | Maa et al. |
| 6,905,560 B2 * | 6/2005 | Cabral et al. ............ 148/512 |
| 7,119,012 B2 | 10/2006 | Carruthera et al. |
| 2002/0182836 A1 * | 12/2002 | Agnello et al. ............ 438/597 |
| 2004/0209432 A1 * | 10/2004 | Ku et al. ............ 438/301 |
| 2004/0266182 A1 | 12/2004 | Ku et al. |
| 2005/0026428 A1 | 2/2005 | Choi |
| 2005/0158996 A1 | 7/2005 | Kim et al. |
| 2005/0202673 A1 * | 9/2005 | Chi et al. ............ 438/655 |
| 2006/0037680 A1 | 2/2006 | Yamakoshi |
| 2006/0051596 A1 | 3/2006 | Jensen et al. |
| 2006/0057844 A1 | 3/2006 | Domenicucci et al. |

* cited by examiner

*Primary Examiner*—Kiesha R Bryant
*Assistant Examiner*—Igwe U Anya
(74) *Attorney, Agent, or Firm*—Scully, Scott, Murphy & Presser, P.C.; Louis J. Percello, Esq.

(57) ABSTRACT

The present invention provides a method for producing thin nickel (Ni) monosilicide or NiSi films (having a thickness on the order of about 30 nm or less), as contacts in CMOS devices wherein an amorphous Ni alloy silicide layer is formed during annealing which eliminates (i.e., completely by-passing) the formation of metal-rich silicide layers. By eliminating the formation of the metal-rich silicide layers, the resultant NiSi film formed has improved surface roughness as compared to a NiSi film formed from a metal-rich silicide phase. The method of the present invention also forms Ni monosilicide films without experiencing any dependence of the dopant type concentration within the Si-containing substrate that exists with the prior art NiSi films.

10 Claims, 5 Drawing Sheets

METAL-RICH PHASES

FIG. 3B
(PRIOR ART)

LOW RESISTIVITY SILICIDE

FIG. 4A

AMORPHOUS SILICIDE PHASE

FIG. 4B

LOW RESISTIVITY SILICIDE

ELIMINATING METAL-RICH SILICIDES USING AN AMORPHOUS NI ALLOY SILICIDE STRUCTURE

RELATED APPLICATIONS

This application is a continuation of U.S. patent application Ser. No. 11/173,038, filed Jul. 1, 2005.

FIELD OF THE INVENTION

The present invention relates to metal contacts for use in semiconductor devices, and more particularly to a method of fabricating a low resistance non-agglomerated nickel monosilicide (NiSi) contact in which an amorphous Ni alloy silicide structure is used for eliminating metal-rich silicides. The elimination of metal-rich silicides using the amorphous Ni alloy silicide structure provides a means for limiting the interface roughness of the resultant NiSi film. Moreover, the amorphous structure used in the inventive method results in the formation of NiSi in a very narrow temperature range that is substantially independent of dopant concentration that is present in a Si-containing material in which the NiSi is formed on. The present invention also provides a semiconductor structure that includes the metal contact formed using the method of the present. It is observed that a reduction in the resistance of the contacts provides a semiconductor device that has the capability to operate at high speeds.

BACKGROUND OF THE INVENTION

In order to be able to fabricate integrated circuits (ICs) of increased performance than is currently feasible, device contacts must be developed which reduce the electrical resistance of the contact to the ICs' Si body or integrated electronic device formed therein. A contact is the electrical connection, at the Si surface, between the devices in the Si wafer and the metal layers, which serve as interconnects. Interconnects serve as the metal wiring that carry electrical signals throughout the chip.

Silicide contacts are of specific importance to IC's, including complementary metal oxide semiconductor (CMOS) devices because of the need to reduce the electrical resistance of the many Si contacts, at the source/drain and gate regions, in order to increase chip performance. Silicides are metal-silicon compounds that provide for low electrical resistivity at the Si/metal interface and are selected to be sufficiently thermally stable for any further processing.

Silicide formation typically requires depositing a transition metal such as Ni, Co or Ti onto the surface of a Si-containing material or wafer. Conventional processing of Ni silicide films begins with depositing a Ni layer with a thickness of about 8 to about 14 nm. The thickness of the resulting silicide is 2.2 times the thickness of the deposited Ni layer, i.e., Ni layers with a thickness of about 8 to about 14 nm form silicides with a thickness of about 18 to about 31 nm, respectively. Following deposition, the structure is then subjected to one or more annealing steps using conventional processes such as, but not limited to: rapid thermal annealing. During thermal annealing, the deposited metal reacts with Si forming a metal silicide. Following the annealing process, a 11 nm Ni metal layer forms a low resistivity Ni monosilicide that has a thickness of approximately 22 nm.

Ni may serve as a metal for silicide formation. One advantage of Ni silicides is that Ni monosilicide contacts consume less Si than conventional Ti or Co silicide contacts. A disadvantage of Ni silicide contacts is that the higher resistivity Ni disilicide phase can be produced during high temperature processing steps, rather than the preferred lower resistivity Ni monosilicide phase. The formation of the Ni disilicide phase is nucleation controlled and disadvantageously consumes more Si than the preferred Ni monosilicide phase. Ni disilicides produce a rougher silicide/Si wafer interface and also have a higher sheet resistivity than the preferred Ni monosilicide phase. A second disadvantage is that thin Ni monosilicide films tend to become discontinuous before Ni disilicide formation leading to high resistivity. A third disadvantage resides in the multiplicity of metal-rich phases that also lead to roughness and sensitivity of the phase formation temperature to the dopant type and concentration incorporated in the starting Si substrate.

In view of the above, it would be highly desirable to provide a Ni monosilicide contact having low resistivity, and high temperature stability, while being easily fabricated utilizing well-known CMOS processing steps. It would also be highly desirable to provide a Ni monosilicide contact that is uniform (i.e., a limited surface roughness) whose formation temperature is not dependent on the dopant concentration within the Si-containing substrate.

SUMMARY OF THE INVENTION

It has been determined by the present applicants that the presence of metal-rich silicide phases such as, for example, $Ni_3Si_2$, in the sequence of forming thin NiSi films leads to significant roughness in the resultant NiSi film. The roughness is at the origin of the texture determination in NiSi (axiotaxy) and consequently of the early degradation of the NiSi films on Si-containing materials. In particular, the presence of $Ni_3Si_2$ in the annealing sequence was shown to be nucleation controlled and laterally non-uniform. The presence of the laterally non-uniform $Ni_3Si_2$ layer leads to characteristic roughness in the resultant NiSi. Prior to the present invention, there was no known technique that could be used to eliminate the formation of the metal-rich silicides and, as such, prior art NiSi contacts are inherently rough having a thickness variation across the entire NiSi layer of about 25% of the thickness or greater after annealing at 550° C. It is noted that the roughness measurements are highly dependent on the annealing temperature used. It is further observed that the roughness is determined by the interface that is formed between the NiSi film and the Si-containing material. The present invention provides a smooth and continuous NiSi/Si-containing interface.

A second limitation of the prior art that the present invention circumvents at least partially is the strong dependence of dopant type concentration on the formation of the low resistivity NiSi phase. By using the inventive method, it is possible to substantially eliminate the dopant dependence and thus allowing one to keep a single NiSi process for any type of device and dopant engineering.

The present invention provides a method for producing thin nickel (Ni) monosilicide or NiSi films (having a thickness on the order of about 30 nm or less), as contacts in CMOS devices wherein an amorphous Ni alloy silicide layer is formed during annealing which eliminates (i.e., completely by-passing) the formation of metal-rich silicide layers. By eliminating the formation of the metal-rich silicide layers, the resultant NiSi film formed has improved surface roughness as compared to a NiSi film formed from a metal-rich silicide phase. The method of the present invention also forms Ni monosilicide films without experiencing substantial dependence of the dopant type and concentration within the Si-containing substrate that exists with prior art NiSi films.

The method of the present invention includes a step of introducing alloying agents into the Ni transition metal layer to at least retard agglomeration or delay $NiSi_2$ formation. More importantly, the alloying agents are introduced at a concentration that is sufficient to cause formation of an amorphous Ni alloy silicide layer during a first annealing step. Applicants have found that the amorphous structure forms during annealing when the total concentration of alloy agent added is about 8 atomic percent or greater. Preferably, the alloying agent, i.e., alloying additive, is used in a concentration from about 8 to about 50 atomic percent, with a range from about 8 to about 15 atomic percent being preferably suitable for low resistance contacts. It is noted that for high amounts of alloying additive, the resistance of the resultant NiSi film may increase substantially.

In broad terms, the method of the present invention comprises:

forming a Ni alloy layer over a portion of a Si-containing material, wherein said Ni alloy layer comprises about 8 atomic percent or greater of one or more alloying additives;

first annealing said Ni alloy layer at a temperature which is effective in converting a portion of said Ni alloy layer into an amorphous Ni alloy silicide layer, said amorphous Ni alloy silicide layer having a higher etch resistance than said Ni alloy layer;

removing remaining Ni alloy layer not converted in said first annealing; and second annealing at a temperature that converts said amorphous Ni alloy silicide layer into a low resistivity NiSi layer.

In the broad case described above, the term "alloying additive" denotes at least one anti-agglomeration additive and/or at least one Ni phase stabilizing additive. This second anneal may be combined with other anneals during conventional processing steps.

In accordance with the present invention, these additives are introduced into the metal alloy layer at a concentration that facilitates the formation of an amorphous Ni alloy silicide layer during the first annealing step. The amorphous layer remains as such until the formation of the crystalline NiSi film. Because the crystallization energy and the enthalpy of formation combined are much larger than the energy variations brought upon by changing the dopant types and concentration, the formation for the monosilicide is much less sensitive to the dopants. The formation of the NiSi effectively occurs in a very narrow temperature range (e.g., a temperature variation of less than 50° C.) that is by comparison almost independent of dopant concentration within the Si-containing material.

It is emphasized that the applicants have determined the optimum concentration range of the alloying additive that can be used in a Ni alloy layer that permits subsequent formation of an amorphous structure, while eliminating the formation of a metal-rich silicide layer. The elimination of the metal-rich silicide layer by forming the amorphous structure provides a uniform NiSi film that has improved surface roughness, while providing a continuous and smooth interface with an underlying Si-containing material layer. Moreover, applicants have determined that the above range of alloy additive also removes the dependence of NiSi formation on the dopant concentration present in the Si-containing material.

In one embodiment of the present invention, a method is provided wherein alloying additives which substantially retard agglomeration or substantially delay the formation of $NiSi_2$ are employed in a sufficient concentration that allows for the formation of an amorphous silicide structure, i.e., amorphous Ni alloy silicide layer, during a first annealing step. The alloying additives that substantially retard agglomeration are referred to herein as "anti-agglomeration" additives. In this embodiment of the present invention, the method of the present invention comprises:

forming a Ni alloy layer over a portion of a Si-containing material, wherein said Ni alloy layer comprises about 8 atomic percent or greater of one or more alloying additives, said one or more alloying additives comprises at least one anti-agglomeration additive;

first annealing said Ni alloy layer at a temperature which is effective in converting a portion of said Ni alloy layer into an amorphous Ni alloy silicide layer, said amorphous Ni alloy silicide layer having a higher etch resistance than said Ni alloy layer;

removing remaining Ni alloy layer not converted in said first annealing; and second annealing at a temperature that converts said amorphous Ni alloy silicide layer into a low resistivity NiSi layer.

This second anneal may be combined with other anneals during conventional processing steps.

In the above embodiment, the alloying additive can comprise elements that are efficient in retarding agglomeration of the Ni monosilicide layer. These anti-agglomeration additives are introduced to the metal alloy layer and facilitate the formation of a low resistivity, substantially non-agglomerated Ni monosilicide layer during the subsequent annealing processing steps.

A second embodiment of the present invention relates to a method of fabricating a substantially non-agglomerated Ni alloy monosilicide which comprises:

forming a Ni alloy layer over a portion of a Si-containing material, wherein said Ni alloy layer comprises about 8 atomic percent or greater of at least two alloying additives, wherein said one or more alloying additives comprise at least one anti-agglomeration additive and at least one Ni monosilicide phase stabilizing alloying additive;

first annealing said Ni alloy layer at a temperature which is effective in converting a portion of said Ni alloy layer into an amorphous Ni alloy silicide layer, said amorphous Ni alloy silicide layer having a higher etch resistance than said Ni alloy layer;

removing remaining Ni alloy layer not converted in said first annealing step; and second annealing at a temperature that converts said amorphous Ni alloy silicide layer into a low resistivity NiSi layer.

The second anneal mentioned above may be combined with other anneals during conventional processing steps.

In the second embodiment, multiple additives are utilized to form a Ni alloy layer that produces a non-agglomerated Ni monosilicide film. Specifically, alloying additives are utilized in this embodiment for retarding both agglomeration of the Ni monosilicide layer and Ni disilicide phase formation, while forming an amorphous structure during the first anneal. The alloying additive selected for being most efficient in increasing the high temperature phase stability of the Ni monosilicide layer, also aide in retarding the formation of the Ni disilicide phase. The resulting low sheet resistance non-agglomerated Ni monosilicide contact withstands higher temperatures without agglomerating or forming the Ni disilicide phase.

It is noted that the methods of the present invention provide a NiSi film having a low resistivity on the order of about 15 to about 40 micro-ohm-cm that has an upper surface that is uniform and smooth. The interface between the silicide and the Si-containing material is slightly rougher but this roughness vary slowly with position (in a gentle wave). That is, the NiSi film formed using the inventive method has an interface roughness leading to thickness variation across the entire film of about 10% of the thickness or less.

The roughness provided by the method of present invention is an improvement over prior art NiSi films. In particularly, prior art NiSi films prepared from pure Ni have an interface that varies by plus or minus 25%, while NiSi films of the present invention have a thickness variation that varies by plus or minus 10% or less. Moreover, the variations in the case of the alloy additives used in the present invention are on a lateral scale that is 5 times the film thickness. This means that it varies very slowly with position. By comparison, the pure Ni film varies by more than 20% of its thickness in less than one thickness of the film laterally. Thus, in the prior art NiSi films, sharp grain grooving and very abrupt thickness changes are observed.

It is observed that the uniformity of formation of the NiSi film using the inventive method is uniform enough in cases in which the dopant concentration in the Si-containing material varies. This suggests that the amorphous layer can be used for complementary metal oxide semiconductor (CMOS) devices in which the dopants As, P, B or others are all present and sometimes do even overlap (n and p regions do overlap in an SRAM structure, for example). At this point, with pure Ni, the variation in formation varies by more than 100° C. However, by using the inventive method this variation is reduced to less than 50° C. for all reasonable dopant ranges and overlap seen in the microelectronic industry (up to 1E16 dose of each of the dopants).

In state of the art SRAM structures, for example, there are n and p doped regions on both Si(100) and poly-Si gates. n-MOS and p-MOS transistors are adjacent to each other so that the dopants n and p do overlap over a small area. These overlap areas occur both on poly-Si and Si(100) areas and are most sensitive to silicide formation and the NiSi (low resistance phase) can form at up to 100° C. higher temperature than the n or p doped regions alone. As a result, it is very difficult as the dopants are increased to form silicide in these very highly doped overlap regions. The formation of the low resistance phase when using the Ni alloys occur from the amorphous silicide phase and is much more uniform in temperature. This occurs because the monosilicide is the first crystalline phase to form and as a result the enthalpy of formation is very large. Facing such a large energy for formation, the differences between dopant types and concentration become minor.

Another aspect of the present invention relates to a CMOS device that comprises at least the substantially non-agglomerated Ni alloy monosilicide contacts of the methods of the present invention. Specifically, the inventive electrical contact comprises:

a Si-containing material having a first conductivity type dopant region and a second conductivity type dopant region that are spaced apart from each other or overlap each other, said dopant regions having different dopant concentrations; and a plurality of substantially non-agglomerated Ni alloy monosilicide contacts located on a portion of said Si-containing material over said dopant regions, where said plurality of substantially non-agglomerated Ni alloy monosilicide contacts comprises about 8 atomic percent or greater of one or more alloying additives.

It is noted that the Ni monosilicide film formed in the present invention includes the one or more alloying additives therein. The one or more alloying additive are present in the Ni monosilicide film in the concentration ranges specified in the present application, i.e., about 8 atomic percent or greater, preferably from about 8 atomic percent to about 50 atomic percent, and more preferably from about 8 atomic percent to about 15 atomic percent.

DETAILED DESCRIPTION OF THE INVENTION

As stated above, the present invention provides a method of fabricating a low resistivity substantially non-agglomerated Ni alloy monosilicide wherein an amorphous structure is used to eliminate the formation of a metal-rich silicide layer and to remove the dependence of dopant concentration on formation of the NiSi layer.

Figure 1A:
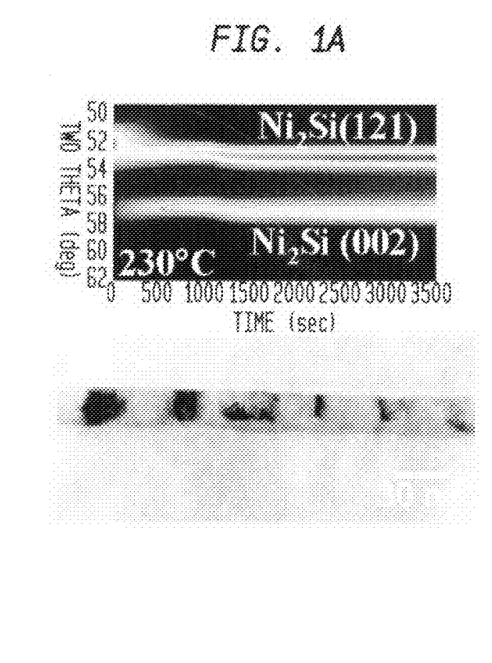
FIGS. 1A-1C are TEMs and Xray diffraction patterns at different points during the formation of a NiSi film from a pure Ni layer formed atop a Si-containing layer.
Figure 1B:
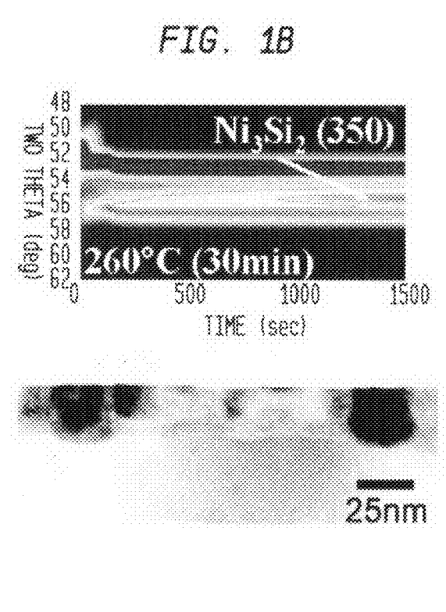
Figure 1C:
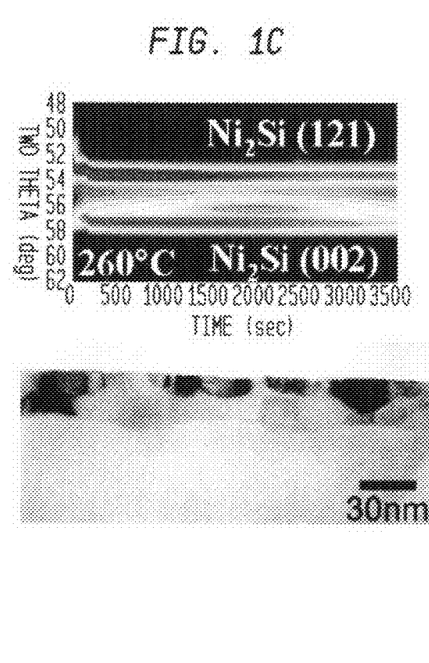

As stated previously, the presence of metal-rich silicide phases of Ni in the sequence of formation of NiSi films leads to significant roughness in the resultant NiSi layer. This roughness is at the origin of the texture determination in NiSi (axiotaxy) and consequently of the early degradation of the NiSi films on Si-containing substrates, e.g., materials. In particular, the presence of $Ni_3Si_2$ in the annealing sequence was shown to be nucleation controlled and laterally non-uniform. This non-uniform phase is shown in the images of FIGS. 1A-1C. Specifically, FIGS. 1A-1C are three TEM images which correspond to the end of the annealing sequence shown using in situ Xray diffraction. Note that above each of the TEM images there is shown the corresponding Xray diffraction pattern. FIG. 1A shows the appearance of $Ni_2Si$ peaks at 230° C. The TEM image of FIG. 1A shows a double layer in which the top layer is $Ni_2Si$ and the bottom layer is an amorphous layer. At 260° C., the $Ni_3Si_2$ peak starts to appear after a few minutes and reaches its maximum after 1500 seconds at which point, the TEM images (see FIG. 1B) clearly shows the same double layered structure, but some crystalline grains of $Ni_3Si_2$ cover the whole thickness of the film. After 3600 seconds at 260° C., the $Ni_3Si_2$ peak has disappeared and NiSi begins to form (see FIG. 1C). The NiSi film formed, however, now keeps a definite roughness on the scale of the distance and size of the prior $Ni_3Si_2$ grains that were consumed during the formation of the NiSi film. The result is then that the presence of the lateral non-uniform $Ni_3Si_2$ layer leads to characteristic roughness in the NiSi film. In applicants' study of more than 2000 NiSi films, it was found that using prior art techniques it was impossible to avoid the formation of the metal-rich silicide phase. As such, prior art films inherently include this roughness that is a direct result of forming a metal-rich silicide phase of Ni during the formation of NiSi films.

The present invention relates to methods where alloying additives are provided for:
  i) Stabilizing the Ni monosilicide phase,
  ii) Retarding agglomeration, and
  iii) Stabilizing the Ni monosilicide phase and retarding agglomeration where the combination of alloying additives does not overwhelmingly increase the sheet resistance of the Ni silicide layer.

Moreover, the alloy additives employed in the present invention are used in a concentration that permits the formation of an amorphous Ni alloy silicide layer (or phase) during a subsequent first anneal which remains in the structure until the NiSi layer is formed. Because of the presence of the amorphous structure in the inventive process, no metal-rich silicide phase is formed and, as a result, the result NiSi film has improved surface roughness as compared with prior art films.

Alloying additives for retarding agglomeration of the Ni monosilicide phase, which are also referred to as anti-agglomeration additives in the present invention, comprise elements including, but not limited to: Ti, V, Cr, Zr, Nb, Mo, Hf, Ta, W, Re, or mixtures thereof. Specifically, alloying additives for retarding agglomeration preferably include Ta, W, Re or mixtures thereof. Alloying additives for stabilizing the mono-silicide phase, also referred to herein as Ni monosilicide phase stabilizing alloying additives, include but are not limited to: Ge, Rh, Pd, Pt or mixtures thereof. Mixtures of these two types of additives are also contemplated herein.

The inventive methods begin with forming a Ni alloy layer over a portion of a Si-containing material. Conventional Si-containing materials include, but are not limited to: Si, single crystal Si, polycrystalline Si, SiGe, amorphous Si, silicon-on-insulator substrates (SOI), SiGe-on-insulator (SGOI), annealed poly Si, or poly Si line structures. The Si-containing material may be the substrate of the device, or a Si-containing layer formed atop the substrate, e.g., a polySi gate or a raised source/drain region.

The Ni alloy layer may be formed using conventional deposition techniques including, but not limited to: chemical vapor deposition (CVD), plasma-assisted CVD, high-density chemical vapor deposition (HDCVD), plating, sputtering, evaporation or chemical solution deposition. The deposition of the Ni alloy layer is continued until an initial thickness of about 30 nm or less, preferably about 15 nm or less, even more preferably about 10 nm or less, is produced.

The alloying additive may be present in the Ni alloy layer in an amount from about 8 atomic % or greater, preferably from about 8 to about 50 atomic %, and most preferably in an amount from about 8 atomic % to 15 atomic % for low resistivity contacts. The alloying additive may be formed initially within a Ni alloy layer during metal alloy deposition, by co-deposition or deposition from an alloy target. Alternatively, the alloying additive may be introduced to the Ni metal layer via ion implantation. Ion implantation techniques use either ion beam mixing of different ion types to produce a desired composition, or implantation of a desired species of alloying additives in a proportion needed to achieve proper stoichiometry. Further, the alloying additive may be introduced as a discrete layer on top of a Ni film through bilayer deposition.

As discussed above, the selection of alloying additives is dependent on the desired performance of the metal alloy layer. One embodiment of the present invention is to retard agglomeration of the Ni monosilicide layer at high temperatures on the order of about 550° C. or greater. In order to retard agglomeration, alloying elements are added to the Ni metal layer, where the alloying elements include, but are not limited to: Ti, V, Cr, Zr, Nb, Mo, Hf, Ta, W, Re, or mixtures thereof and most preferably Ta, W, and Re. These additives are anti-agglomeration additives.

Another aspect of the present invention includes the selection of alloying additives that are most efficient in stabilizing the Ni monosilicide phase in order to retard phase changes to Ni disilicide at high temperatures. Alloying additives efficient for stabilizing the Ni monosilicide phase include, but are not limited to: Ge, Rh, Pd, Pt or combinations thereof. These additives are Ni monosilicide phase stabilizing additives. A potential disadvantage of the Ni monosilicide phase stabilizing additives, such as Ge, Rh, Pd, and Pt, is that they increase the sheet resistitivity of the Ni silicide layer, decreasing the Ni silicide's performance as a contact. Note here that anti-agglomeration additives also have some phase stabilization properties and that phase stabilizing additives also have some anti-agglomeration properties.

A third embodiment of the present invention forms a ternary Ni alloy using both alloying additives, which are efficient in retarding agglomeration and are efficient for stabilizing the Ni monosilicide phase, to form a Ni silicide. Preferably, multiple alloying additives are selected, one from the group consisting of Ti, V, Cr, Zr, Nb, Mo, Hf, Ta, W, Re, and mixtures thereof, for preventing agglomeration; and another selected from the group consisting of Ge, Rh, Pd, Pt, and mixtures thereof, for phase stability. The ternary metal alloy layer employed in this embodiment of the present invention comprises Ni, a Ni monosilicide phase stabilizing additive, and an anti-agglomeration additive.

An advantage of utilizing the above Ni ternary alloy composition is that a more stable Ni silicide layer is formed in terms of phase stability and agglomeration. A further advantage using both types of additives to form a Ni ternary alloy is that while additives most efficient for stabilizing the Ni monosilicide phase increase the sheet resistance of the Ni silicide formed therefrom, elements that serve as alloying additives for retarding agglomeration increase the sheet resistance of the Ni silicide to a lesser degree. Therefore by mixing both additives both low sheet resistivity and Ni monosilicide phase stability can be achieved. Unexpectedly, combining the two categories of alloying additives in a ternary metal alloy layer produces a silicide with a sheet resistance that is significantly lower than if only alloying additives that are efficient for phase stabilization had been utilized.

Optionally, following Ni metal alloy layer formation, a barrier layer may be formed over the metal alloy layer. The optional barrier layer may comprise any material that protects the Ni metal alloy layer from oxidation. Examples of materials suitable for barrier layers include, but are not limited to: SiN, TaN, TiON, TiN and mixtures thereof. The optional barrier layer is removed after annealing of the metal alloy layer during the selective etch.

Following formation of the Ni alloy layer, a first annealing processing step is performed at a temperature that is effective in converting a portion of the metal alloy layer into a an amorphous Ni alloy silicide layer. Often this thermal anneal is conducted using Rapid Thermal Anneal (RTA) or other conventional annealing process. The first thermal anneal is typically performed at a temperature from about 250° C. to about 400° C., most preferably from about 300° C. to about 350° C. In one embodiment of the present invention, a thermal dose of about 320° C. for approximately 30 seconds is employed. It is noted that amorphous Ni alloy silicide formed during the first anneal step has a higher etch resistance than the Ni alloy layer.

Following the formation of the amorphous Ni alloy silicide layer, the unreacted remaining portions of the Ni metal alloy layer are removed using a conventional etch process, such as wet etching, reactive-ion etching (RIE), ion beam etching, or plasma etching. As stated above, the resultant amorphous Ni alloys silicide layer, e.g., phase, that remains is more resistive to etch processing steps when compared to the non-reacted metal layer that is removed during the etching step.

A second anneal is performed to a temperature that is effective to further reduce the resistance of the silicide contact and in converting the amorphous Ni alloy silicide layer into a Ni monosilicide layer. The second anneal may be performed at a temperature from about 400° C. to 700° C., with a temperature from about 400° C. to about 600° C. being more preferred. It is noted that the first anneal is typically performed at a lower temperature than the second annealing step. It is further noted that the anneals a performed in an inert ambient such as He, Ar, $N_2$ or mixture thereof.

Figure 2:
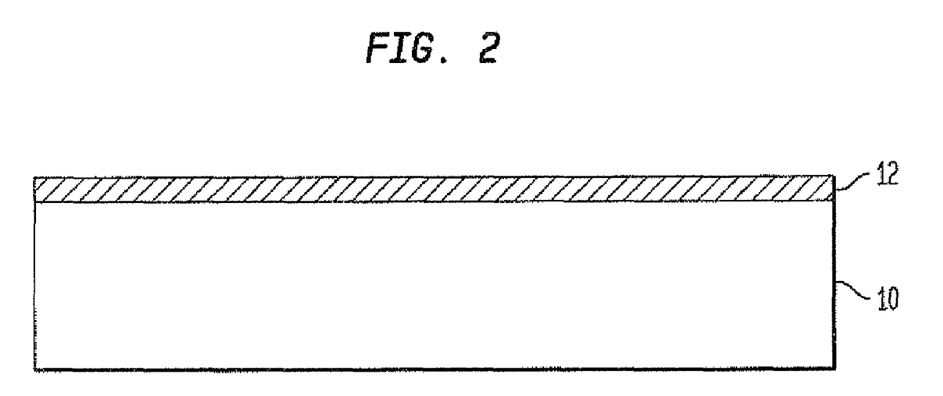
FIG. 2 is a cross sectional representation of the inventive substantially non-agglomerated Ni alloy monosilicide film or contact.

Another aspect of the present invention relates to a CMOS device produced using the above method. Referring to FIG. 2, the inventive CMOS device comprises of a low resistivity substantially non-agglomerated Ni monosilicide contact 12 formed atop a Si-containing material 10. The Si-containing material 10 may have a first dopant region of a first conductivity type and a second dopant region of a second conductivity, in which the dopant concentrations within the dopant regions may vary. The dopant regions can be spaced apart from each other or overlap each other to a varying degree.

It has been observed that the formation of the NiSi film using the inventive method is uniform enough in cases in which the dopant concentration in the Si-containing material varies. This suggests that the amorphous layer can be used for complementary metal oxide semiconductor (CMOS) devices in which the dopants As, P, B or others are all present and sometimes do even overlap (n and p regions do overlap in an SRAM structure, for example). At this point, with pure Ni, the variation in formation varies by more than 100° C. However, by using the inventive method this variation is reduced to less than 50° C. for all reasonable dopant ranges and overlap seen in the microelectronic industry (up to 1E16 dose of each of the dopants).

In state of the art SRAM structures, for example, there are n and p doped regions on both Si(100) and poly-Si gates. n-MOS and p-MOS transistors are adjacent to each other so that the dopants n and p do overlap. These overlap areas occur both on poly-Si and Si(100) areas and are most sensitive to silicide formation and the NiSi (low resistance phase) can form at up to 100° C. higher temperature than the n or p doped regions alone. As a result, it is very difficult as the dopants are increased to form silicide in these very highly doped overlap regions. The formation of the low resistance phase when using the Ni alloys occur from the amorphous silicide phase and is much more uniform in temperature. This occurs because the monosilicide is the first crystalline phase to form and as a result the enthalpy of formation is very large. Facing such a large energy for formation, the differences between dopant types and concentration become minor. The energy of crystallization helps this trend further.

The non-agglomerated Ni alloy monosilicide contact 12 can be subjected to the high processing temperatures associated with conventional semiconductor production, without negatively affecting the performance of the contact. The composition of the inventive substantially non-agglomerated Ni alloy monosilicide contact includes at least one alloying additive in an amount from about 8 atomic % or greater, preferably from about 8 to about 50 atomic %, and even more preferably from about 8 to about 15 atomic %. The alloying additive is selected as described in the above inventive methods.

The following examples are given to illustrate the present invention and to demonstrate some advantages that can arise therefrom.

Example 1

This example is provided to show that the inventive method provides improved surface roughness as compared to a prior art method in which pure Ni was used. In the case of the inventive sample, a Ni alloy including Ni, 5 atomic % Pt and 5 atomic % Re was used. Specifically, a prior art NiSi film was formed by forming a layer of pure Ni on a surface of a Si-containing material. That structure was then annealed at 260° C. for a time period of about 1 hour. After this anneal, unreacted Ni was removed and a second anneal was performed at a temperature of about 550° for a time period of about 30 seconds. An inventive NiSi film was prepared using the same procedure as defined above except that Ni alloy including Ni, 5 atomic % Pt and 5 atomic % Re was used instead of pure Ni.

Figure 3A:
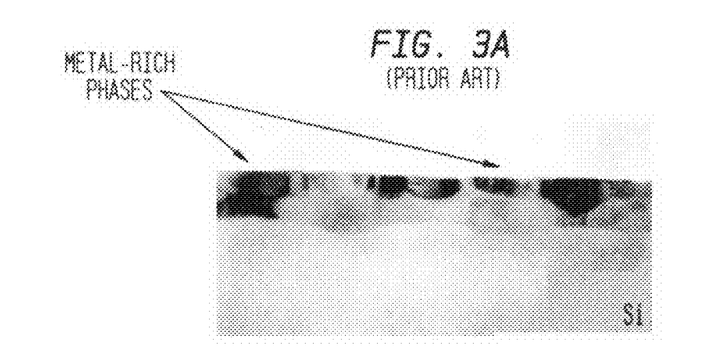
FIGS. 3A-3B are TEMs showing the formation of a prior art NiSi contact after a first anneal and after a second anneal in which pure Ni was used.
Figure 3B:
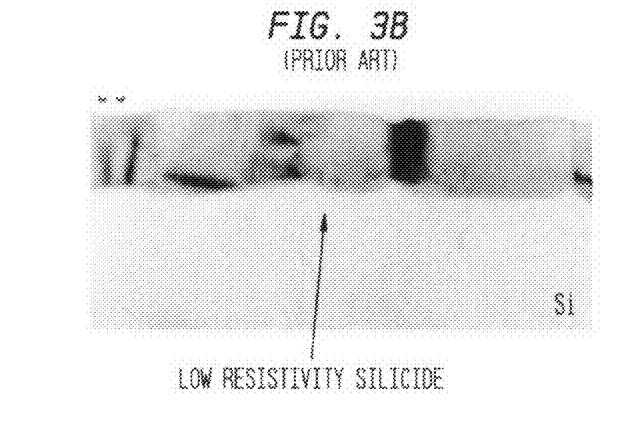
Figure 4A:
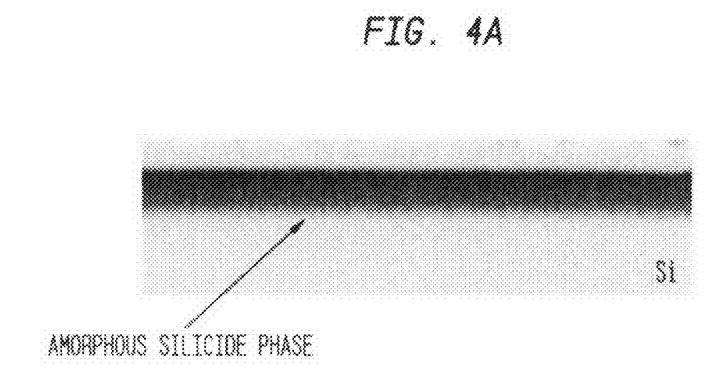
FIGS. 4A-4B are TEMs showing the formation of an inventive NiSi contact after a first anneal and after a second anneal in which an Ni alloy including Ni, 5 atomic % Pt and 5 atomic % Re was used.
Figure 4B:
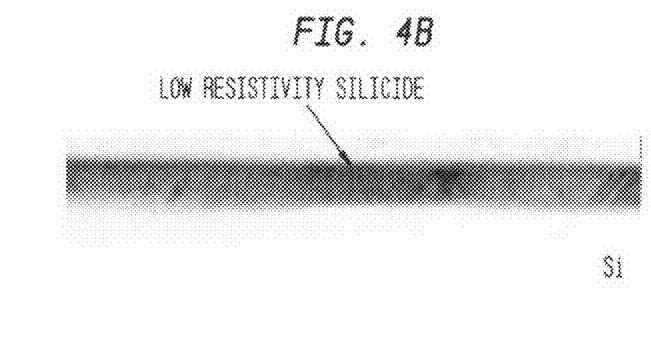

FIGS. 3A-3B are TEMs showing the formation of the prior art NiSi contact after the first anneal and after the second anneal, respectively. FIGS. 4A-4B are TEMs showing the formation of the inventive NiSi contact after the first anneal and after the second anneal, respectively.

From these TEMS, particularly the TEMs of FIGS. 3B and 4B, the thickness variation and the distance between the peaks and valleys were measured. The results of these measurements are reproduced in Table 1.

TABLE 1

|  | Pure Ni | Ni alloy including Ni, 5 atomic % Pt and 5 atomic % Re |
| --- | --- | --- |
| Thickness Variation | 25% | Less than 10% |
| Distance between peaks and valleys | 1 × the film thickness | 5 × the film thickness |

It was further observed that the roughness after the low temperature first anneal is similar to the 550° C. second anneal. These results thus indicated that the roughness was set by phase sequence (history) and that the amorphous phase formed in the inventive method kept the roughness to a minimum. This meant slower variations in thickness along the film.

Example 2

In this example, a NiSi contact was prepared using a Ni alloy that included Ni, 5 atomic % Pt and 5 atomic % Re that was formed atop a Si-containing material and annealed at 3°

Figure 5:
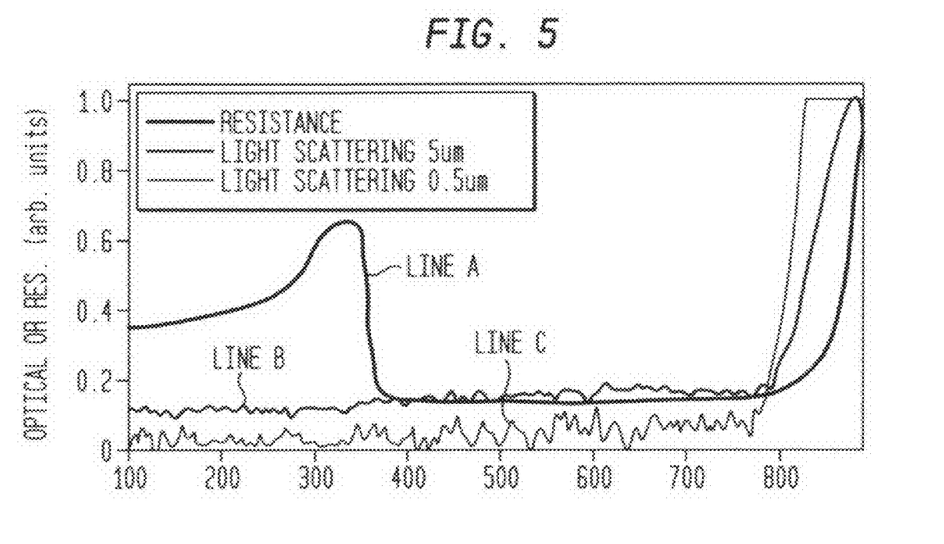
FIG. 5 is plot of Optical or Resistivity (arb. units) vs. Temperature (° C.) for the NiSi contact produced in Example 2 using a Ni alloy including Ni, 5 atomic % Pt and 5 atomic % Re. Line A is resistance, line B is light scattering at 5 µm, line C is light scattering at 0.5 µm.

C./s in purified He. FIG. 5 is plot of optical or Resistivity (arb. units) vs. Temperature (° C.) for the NiSi contact produced this example. Line A is resistance, line B is light scattering at 5 μm, line C is light scattering at 0.5 μm. The resistance trace clearly shows a simple maximum before the major drop into the monosilicide. This already suggests the formation of a single phase. In the case of pure Ni films, this curve shows multiple maxima and minima while the metal rich phases form before NiSi formation. The light scattering signals do not show significant variations before the sample reaches a temperature at which the film agglomerates.

Figure 6:
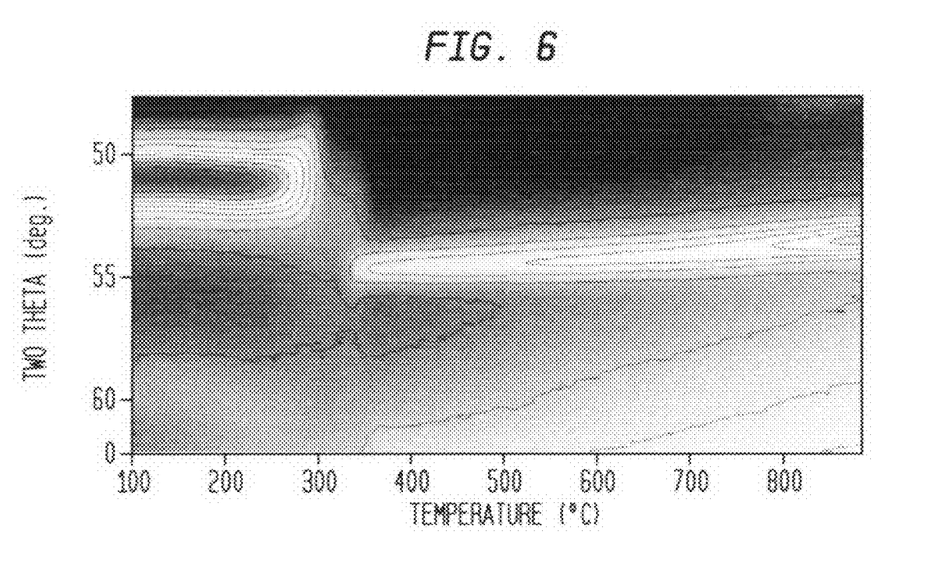
FIG. 6 is an Xray diffraction plot of Two theta (deg) vs. Temperature (° C.) for the NiSi contact produced in Example 2 using a Ni alloy including Ni, 5 atomic % Pt and 5 atomic % Re.

FIG. 6 is an Xray diffraction plot of Two theta (deg) vs. temperature (° C.) for the NiSi contact produced in Example 2 using a Ni alloy including Ni, 5 atomic % Pt and 5 atomic % Re. The Ni peak is observed up to about 300° C. and a monosilicide is clearly observed at temperatures slightly above 350° C. Between 300° and 350° C., no crystalline peak are observed, suggesting a film that is amorphous.

Example 3

This example is provided to show that the inventive method limits the dopant dependence on NiSi formation that is typically exhibited in prior art NiSi films. Specifically, prior art NiSi films were formed by forming a layer of pure Ni on a surface of a polySi-containing material containing various dopants (B, P and/or As). Those structures were then annealed as described in Example 2. Inventive NiSi films were prepared using the same procedure as defined above except that Ni alloy including Ni, 5 atomic % Pt and 5 atomic % Re was used instead of pure Ni.

Figure 7A:
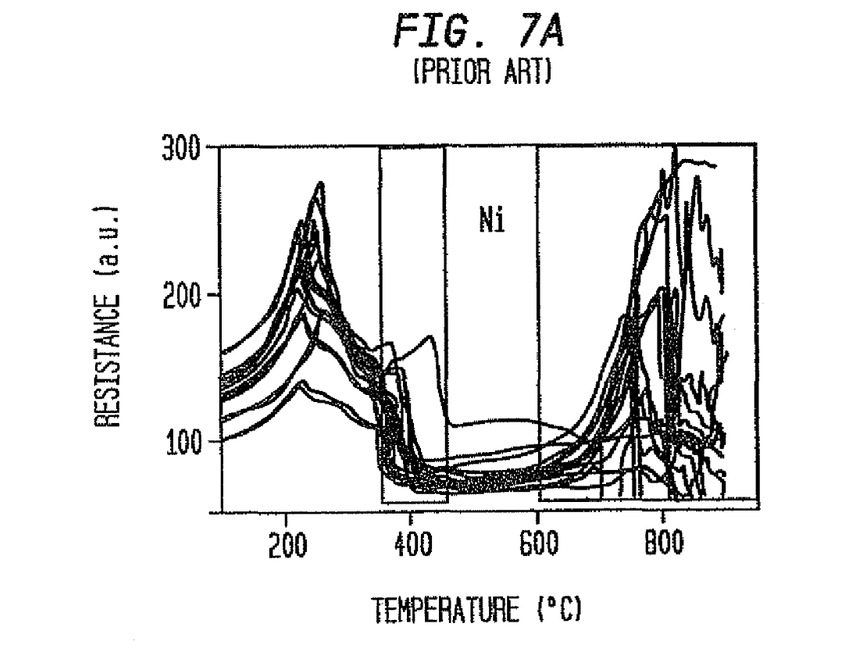
FIGS. 7A and 7B are the resistance measurements with different dopants underlying a polySi substrate for a prior art NiSi film made from pure Ni and an inventive NiSi film made from a Ni alloy including Ni, 5 atomic % Pt and 5 atomic % Re.
Figure 7B:
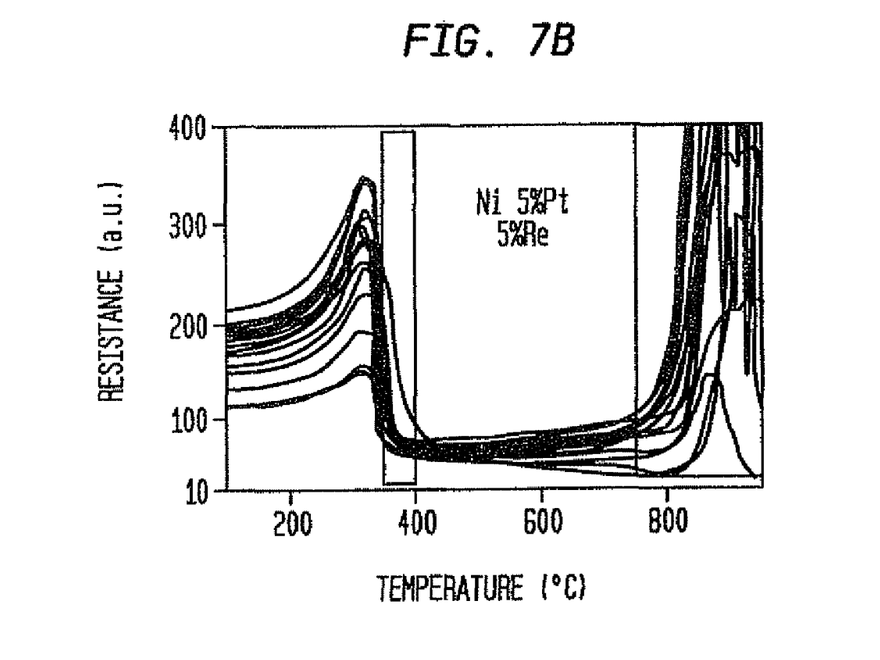

In each case FIGS. 7A and 7B are the resistance measurements with different dopants underlying a polySi substrate for a prior art NiSi made from pure Ni and an inventive NiSi made from a Ni alloy including Ni, 5 atomic % Pt and 5 atomic % Re, respectively. Two important conclusions were determined from these measurements. First, the formation temperature window decreased for the Inventive samples relative to the prior art samples. Second, the agglomeration was pushed to higher temperatures for the inventive samples relative to the prior art samples. The decrease in the formation temperature window for the inventive NiSi alloy is clear. In this case, most dopant (and dopant concentrations) studied lead to resistance drop occurring almost at the same temperature showing the relative independence of this NiSi process to dopants.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A film comprising:
a layer of Ni monosilicide comprising about 8 atomic percent or greater of one or more alloying additives, wherein said amount of one or more alloying additives is sufficient to permit an amorphous structure to form during fabrication of the layer of Ni monosilicide, while preventing a metal rich silicide to form, and wherein said one or more alloying additives comprises at least one anti-agglomeration additive, at least one Ni phase stabilization additive or mixtures thereof, and said layer of Ni monosilicide having an interface roughness such that the thickness variation is less than about 10% of the film.

2. The film of claim 1 wherein said one or more alloying additives is present in said film in an amount from about 8 atomic percent to about 50 atomic percent.

3. The film of claim 1 wherein said one or more alloying additives is present in said film in an amount from about 8 atomic percent to about 15 atomic percent.

4. The film of claim 1 wherein said one or more alloying additives comprises at least one anti-agglomeration additive selected from the group consisting of Ti, V, Cr, Zr, Nb, Mo, Hf, Ta, W, Re and mixtures thereof.

5. The film of claim 4 wherein said at least one anti-agglomeration additive is Ta, W, Re or mixtures thereof.

6. The film of claim 1 wherein said one or more alloying additives comprises at least one Ni phase stabilization additive selected from the group consisting of Ge, Rh, Pd, Pt and mixtures thereof.

7. The film of claim 1 wherein said one or more alloying additives comprises 5 atomic % Pt and 5 atomic percent Re.

8. The film of claim 1 wherein said layer of Ni monosilicide has a resistivity of about 15 to about 40 micro-ohm-cm.

9. The film of claim 1 wherein said layer of Ni monosilicide is located on a Si-containing material.

10. The film of claim 9 wherein said Si-containing material comprises Si, single crystal Si, polycrystalline Si, SiGe amorphous Si, a silicon-on-insulator, a SiGe-on-insulator, annealed polySi, or a poly Si line structure.

* * * * *